United States Patent [19]

Lehning

[11] 4,328,509

[45] May 4, 1982

[54] CURRENT HOGGING LOGIC CIRCUIT WITH NPN VERTICAL REVERSAL TRANSISTOR AND DIODE/PNP VERTICAL TRANSISTOR OUTPUT

[75] Inventor: Heinz Lehning, Nyon, Switzerland

[73] Assignee: Robert Bosch GmbH, Stuttgart, Fed. Rep. of Germany

[21] Appl. No.: 94,119

[22] Filed: Nov. 14, 1979

Related U.S. Application Data

[63] Continuation of Ser. No. 403,767, Oct. 5, 1973, abandoned.

[30] Foreign Application Priority Data

Sep. 1, 1973 [DE] Fed. Rep. of Germany ....... 2344244

[51] Int. Cl.³ .......................................... H01L 29/72
[52] U.S. Cl. ....................................... 357/36; 357/35; 357/44; 357/48; 357/92; 307/299 B; 307/303
[58] Field of Search ...................... 357/35, 36, 48, 44, 357/92; 307/299 B, 303

[56] References Cited

U.S. PATENT DOCUMENTS

| | | | |
|---|---|---|---|
| 3,713,908 | 1/1973 | Agusta et al. | 357/44 |
| 3,725,683 | 4/1973 | Andersen | 357/44 |
| 3,823,353 | 7/1974 | Berger et al. | 357/44 |
| 3,829,718 | 8/1974 | Hart | 357/35 |
| 4,056,810 | 11/1977 | Hart et al. | 357/36 |
| 4,153,909 | 5/1979 | Dobkin | 357/35 |

Primary Examiner—Joseph E. Clawson, Jr.
Attorney, Agent, or Firm—Frishauf, Holtz, Goodman & Woodward

[57] ABSTRACT

In an n-type base island are provided a p-type emitter stripe and a p-type output collector stripe, with one or more intermediate control collector stripes for switching the current of the output collector. The pattern of control collector stripes can provide AND functions, OR functions or combinations thereof in a single logic element in a single base island. Each output is provided with an npn current reversal transistor in a separate island and if more than one input is to be operated by the output of a logic element, decoupling and fan-out capability are provided by vertical pnp transistors driven by the inverter transistors, which do not require an island completely separate from the inverter transistor, although an isolating barrier stripe can be helpful. A bistable flipflop and a frequency divider cell are shown to illustrate the use of these logic structures. The decoupling referred to can be provided without fan-out amplification by means of diodes.

5 Claims, 28 Drawing Figures

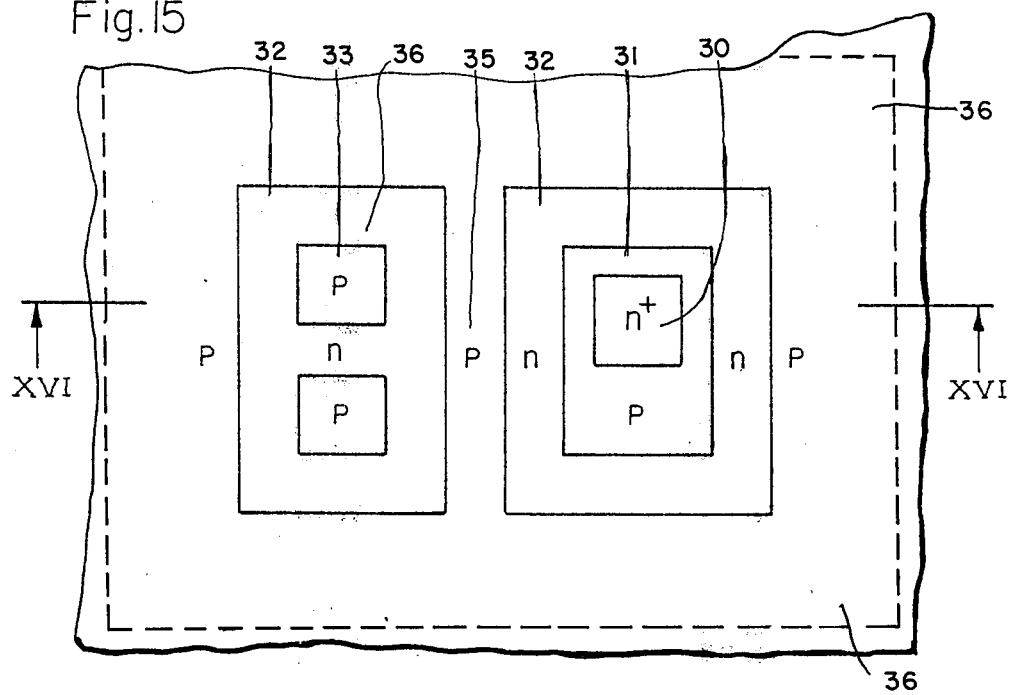
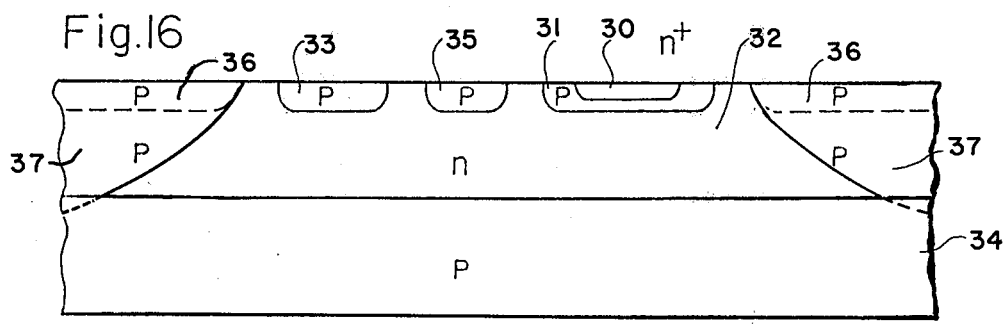
34 CORRESPONDS TO 10 OF FIG. 3
37 CORRESPONDS TO { 13 OF FIG. 3
25 OF FIG. 14

CURRENT HOGGING LOGIC CIRCUIT WITH NPN VERTICAL REVERSAL TRANSISTOR AND DIODE/PNP VERTICAL TRANSISTOR OUTPUT

This is a continuation of application Ser. No. 403,767 filed Oct. 5, 1973, abandoned.

This invention relates to a logic structure realizable with standard planar technology on silicon substrates.

In the known logic circuits or structures in standard silicon planar technology, the logical functions are realized by individual transistors, each of which must be provided with an individual isolating island in the integrated circuit. For this reason the surface space requirement of these circuits is relatively high. In addition, the sensitivity of these circuits to disturbances is not always sufficiently low.

It is an object of the present invention to provide a logic structure of the silicon planar type with high immunity to disturbance and with small space requirement.

SUBJECT MATTER OF THE PRESENT INVENTION

Briefly, logic elements are provided in the form of lateral pnp transistor structures diffused into an n-type island of an epitaxial layer that serves as a common base, and between the p-type emitter zone and the p-type output collector zone of each logical element at least one further p-type zone is provided and so disposed that when it is negatively biased with respect to the emitter, it prevents charges injected by the emitter from reaching the output collector, thus operating as a control collector.

Control collectors between an emitter and an output collector can be arranged broadside for an AND function, requiring all the collectors of the broadside array to be negatively biased to prevent charge carriers from reaching the output collector. They can likewise be disposed in tandem so that negative bias on any one of the control collectors will prevent charge carriers from reaching the output collector, thus providing an OR function. Combinations of AND and OR functions can be provided between one emitter and one output collector and two or more emitters can be used with a common output collector.

Since the logic used is current logic rather than voltage logic, transistors are associated with each output collector to reverse the output terminal current without providing a logic inversion. When one output collector controls the control collectors of two or more following stages and some of the latter are not disposed immediately adjacent the corresponding emitter, the further interposition of a diode or of a vertical pnp transistor provides decoupling of the inputs of the following stages. The vertical pnp transistor also provides the advantage of additional current amplification.

The logic structure of this invention is a current source logic and its particular advantage lies in that the logical connections are provided by lateral pnp structures, and that by suitably disposed p-type collector geometries for "control collectors" the injection current of the emitter which is injected towards an "output collector" can be switched. This means that the logical functions are no longer realized by individual transistors as in the known circuits, but by functional units. All logic elements of a circuit can thus be laid down by diffusion of p zones in a single isolating island of an epitaxial layer.

The invention will be described, particularly with respect to a static frequency divider as an illustrative embodiment, with reference to the annexed drawings, in which:

FIG. 7a shows the suggested circuit symbol for the inverter structure of FIG. 6a;

FIG. 11b is the proposed symbolic circuit representation of the arrangement of FIG. 11a;

FIG. 15 is a plan view of an npn reversal transistor with two vertical pnp decoupling transistors in the same island; and FIG. 16 is a cross-section along the line II—II of FIG. 15.

Figure 1:
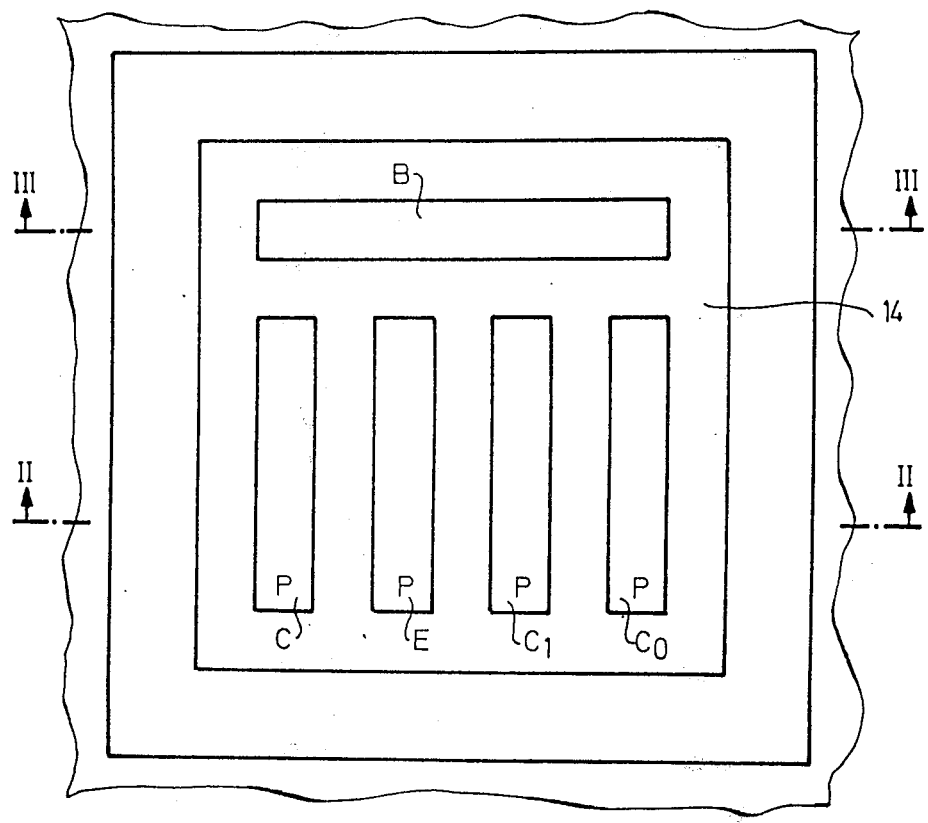
FIG. 1 is a plan view of a switchable current source in accordance with the invention.
Figure 2:
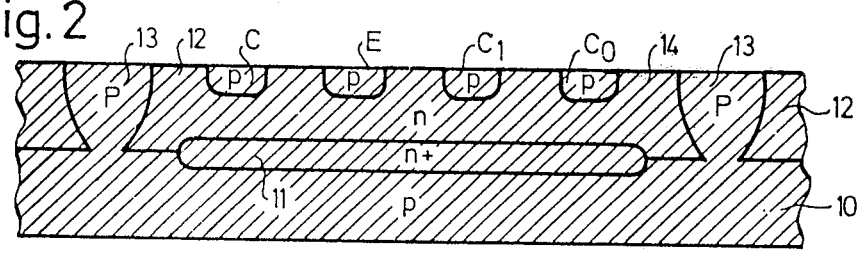
FIG. 2 is a cross-section along the line II—II of FIG. 1.
Figure 3:
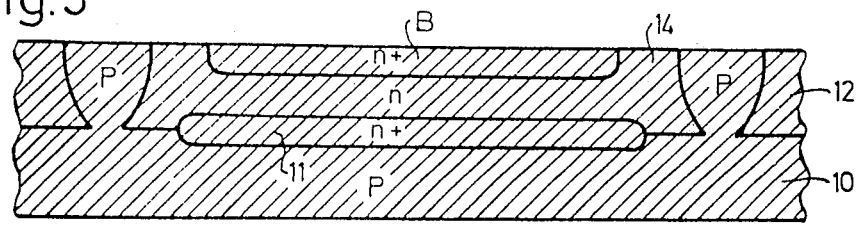
FIG. 3 is a cross-section along the line III—III of FIG. 2.

In FIGS. 1 to 3 a switchable current source is shown as the simplest example of a logical circuit in accordance with the present invention. As shown in FIGS. 2 and 3, the device is built on a carrier substrate 10 of p-type silicon. A highly doped n-type zone 11, a so-called $n^+$ zone, is first formed on the surface of the substrate 10. When this conducting layer 11 has been formed, an epitaxial layer 12 is grown on the substrate 10 with n-type silicon. As this epitaxial layer grows, a portion of the impurity centers of the conducting layer 11 diffuse into the epitaxial layer 12, so that the conducting layer 11 stretches part way into the epitaxial layer 12. When the epitaxial layer 12 has been fully constituted, a p-type isolating barrier 13 is formed by diffusing a p-type zone so deep that it joins to the p-type substrate 10 to form a continuous tub shaped p-type region 13,10 that separates the epitaxial island 14 from the remainder of the epitaxial layer 12.

As shown in FIGS. 1 and 3, an $n^+$ base contact zone is diffused in the epitaxial island 14 which serves as the base zone of the logic structure. Four p-type zones C,E,Cl and $C_o$ are also diffused into the island 14, in this case as parallel stripes perpendicular to the orientation of the base contact stripe B. The p-type zone E provides the emitter and the zones $C_1$ and C are collector zones forming with the emitter a conventional lateral double collector pnp transistor. There is, however, a further collector $C_o$ which is without current so long as the collector $C_1$ is biased negatively with respect to the emitter E. If the collector $C_1$ is left open-circuited, it goes into saturation and consequently takes on a potential close to the emitter potential. Consequently, the density of charge carrying holes at the junction between the collector zone $C_1$ and the base zone 14 corresponds more or less to the value at the emitter-base junction so that the edge of the collector zone $C_1$ facing the collector zone $C_o$ likewise operates as an emitter and further injects charge carriers in the direction of $C_o$.

Thus, when the collector $C_1$ is not biased, the emitter E operates together with the outer collector $C_o$ as a normal pnp transistor, in which case (with unchanged base-emitter voltage) somewhat less current is delivered to the collector $C_o$ than previously to the collector $C_1$ because of the greater total width of the base zone and the parasitical injection of the collector $C_1$.

If the collector $C_1$ is negatively biased, however, it then sucks up all the charge carriers injected by the righthand side of the emitter. In this case, with normal bias supplied to the collector $C_o$, a current is measured at collector C which is only slightly greater than the junction leakage current $I_{CoBO}$.

With such transistors it is possible to constitute current sources that are switchable by switching on and off the current of the collector $C_1$ or by applying corresponding voltage to this collector. Collector C can serve as a reference collector, for biasing the base-emitter junction, as it is done in usual current source connections.

Figure 4:
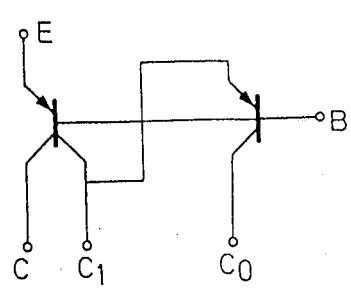
FIG. 4 is the equivalent circuit of the arrangement shown in FIGS. 1-3.
Figure 5:
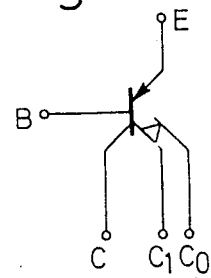
FIG. 5 shows the suggested circuit symbol for the arrangement shown in FIGS. 1-3.

FIG. 4 shows the equivalent circuit and FIG. 5 shows the suggested circuit diagram symbol of the switchable current source shown in FIGS. 1-3.

The structure E, $C_1$, $C_o$ shown in FIGS. 1-5 can be modified by provision of additional p-type zones between the emitter E and the output collector $C_o$ and/or by subdivision of the collector zone $C_1$.

Figure 6A:
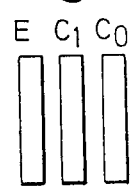
FIG. 6a shows the structure of an inverter, in plan view.
Figure 6B:
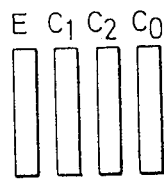
FIG. 6b shows the structure of an NOR-gate, in plan view.
Figure 6C:
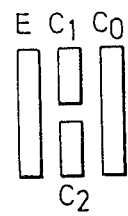
FIG. 6c shows the structure of an NAND-gate, in plan view.
Figure 7A:
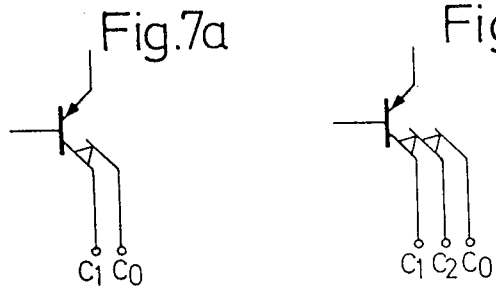
Figure 7B:
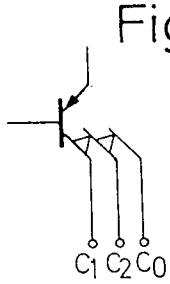
FIG. 7b shows the suggested circuit symbol of the NOR-gate structure of FIG. 6b.
Figure 7C:
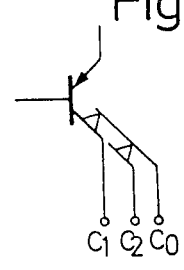
FIG. 7c shows the suggested circuit symbol for the NAND-gate structure of FIG. 6c.

FIGS. 6b and 6c show two simple examples of this type, while FIG. 6a again shows the arrangement of FIGS. 1-5 with the collector C left out.

As shown in FIG. 6b a second control collector $C_2$, likewise in the form of a p-type zone, is provided between the control collector $C_1$ and the output collector $C_o$. The two control collectors $C_1$ and $C_2$ are in the shape of parallel stripes, arranged one behind the other in the direction of charge carrier movement, so that each quite independently of the other can prevent charge carriers injected by the emitter E from reaching the output collector $C_o$ if the control collector in question is negatively biased.

In the arrangement shown in FIG. 6c, two control collectors $C_1$ and $C_2$ are so arranged between the emitter E and the output collector $C_o$, that charge carriers injected by the emitter E cannot be prevented from reaching the output collector $C_o$ unless both control collectors $C_1$ and $C_2$ are negatively biased at the same time. This corresponds to a subdivision of the collector zone $C_1$ of FIG. 6a into two subzones $C_1$ and $C_2$. The gap between these subzones will not allow any charge carriers to pass if it is no greater than 10 μm.

If currents are used as logical variables and if the logical conditions are defined as:

1 ≙ current

0 ≙ no current the structures of FIGS. 6b and 6c respectively perform NOR and NAND functions, and the structure of FIG. 6a is to be regarded as an inverter.

The one further condition must be fulfilled for the provision of a usable logic structure: the output of one gate must be suitable for controlling the inputs of the other gates. It is accordingly still necessary to reverse the direction of the output currents and to define the logical levels more precisely:

| | |
|---|---|
| 1 ≙ | current flow, at |
| | inputs: outward from the terminal; |
| | at outputs: into the terminal; |
| 0 ≙ | no current. |

Figure 8A:
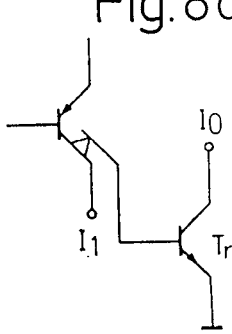
FIG. 8a is a diagram of the circuit for the complete inverter.
Figure 8B:
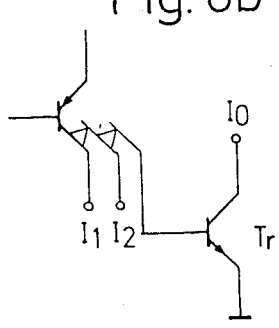
FIG. 8b is a diagram of the circuit for the complete NOR-gate.
Figure 8C:
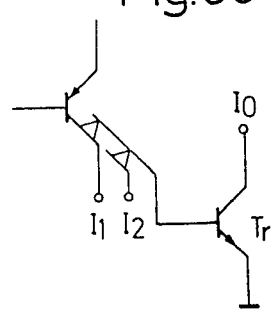
FIG. 8c is a diagram of the circuit for the complete NAND-gate.

For reversal of the current of the output collectors $C_o$, an npn reversal transistor $T_r$ is connected to follow each output collector $C_o$. This reversal provides output current of the proper polarity, but does not produce a logical inversion between from 1 to 0 and vice versa in terms of current logic. The npn reversal transistor, moreover, regenerates the current coming from the output collector $C_o$, that is, it restores the appropriate level of current for reliable logic, for it has already been mentioned that there is always somewhat less current at the output collector than must be drawn from the input collectors $C_1$ and $C_2$. Accordingly, FIGS. 8a, 8b and 8c represent the complete basic gates in the current source logic of the present invention.

Figure 9A:
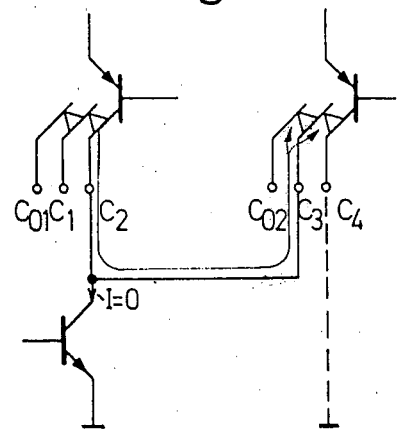
FIG. 9a is a circuit arrangement showing a case of undesired injection.

If two or more gate inputs are to be controlled by the output of a single gate, undesired injection can arise, as shown in FIGS. 9a. This is always to be expected if input collectors of gates are connected together, among which at least one is not immediately adjacent an emitter.

In FIG. 9a the condition of operation is considered in which the npn transistor is blocked and the collector $C_4$ is biased. Since this is the case of a NOR-gate, no current should arrive at the output collector $C_{o2}$. In this case, however, $C_3$ is connected with the input of another NOR-gate ($C_2$). $C_2$ is immediately adjacent an emitter, so that $C_2$ and $C_3$ are supplied with injection current and the output $C_{o2}$ therefore also receives current in this undesired way.

Figure 9B:
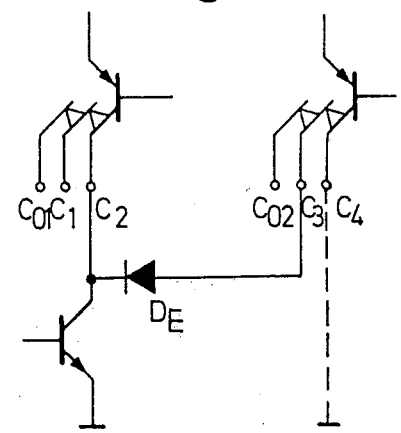
FIG. 9b is a diagram of a circuit in which undesired injection is suppressed.

The undesired injection can be suppressed by provision of a decoupling diode $D_E$ ahead of the input $C_3$ (see FIG. 9b).

The decoupling diodes can be replaced by vertical pnp transistors, which can be located in the same isolating island of the epitaxial layer as the npn transistor of the previous stage.

Figure 10:
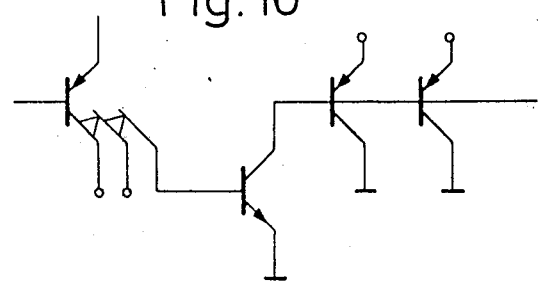
FIG. 10 is a diagram of a circuit for input decoupling and increase of the fan-out capability.

FIG. 10 shows a gate provided with such an output circuit. It is of course possible to control all gate inputs by vertical pnp transistors (in which case the n+-contact island of the npn-pnp structure is not necessary), an arrangement that leads to a substantially greater fan-out capability on account of the then greater current amplification of the npn-pnp structure (compared to an npn transistor alone).

Figure 11A:
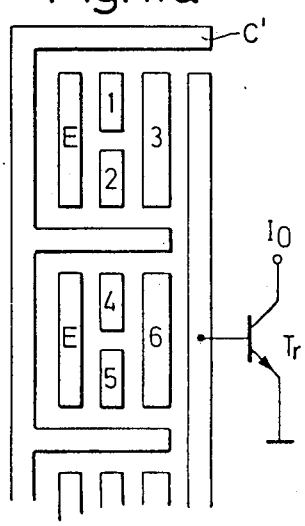
FIG. 11a is a plan view of a logic structure for realizing mixed logic functions.
Figure 11B:
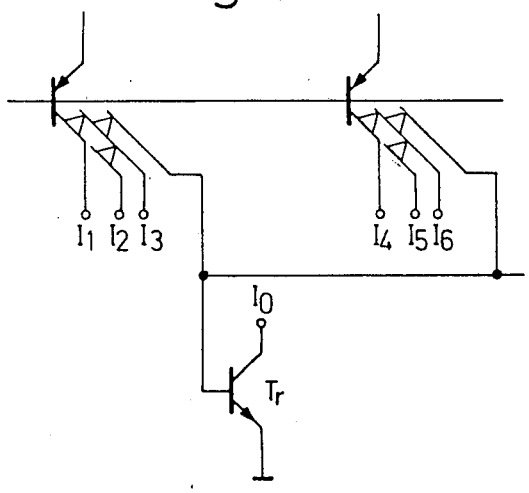
Figure 11C:
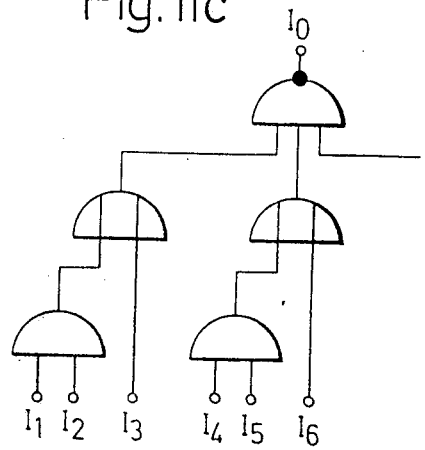
FIG. 11c is the circuit representation of the arrangement of FIG. 11a with conventional gate symbols.

As may be observed in FIGS. 6b and 6c, in this type of logic NAND and NOR functions can be constituted at the same expense. The efficiency of surface utilization becomes even greater when mixed gate functions are required. FIGS. 11a–11c show the type of complex operations that are thus possible. It is to be noted that for all logical functions that operate on a single output, only one npn transistor $T_r$ is used.

Logical functions of the following forms are possible:

$$I_o = \overline{(I_1 I_2 + I_3) \cdot (I_4 I_5 + I_6) \cdots},$$

where the number of inputs of OR and AND gates (see FIG. 11c) can be raised still higher.

The reference collector C' in FIG. 11a also prevents carrier diffusion around the control collectors to the output collectors and from one section to another.

The number of inputs that can be used (fan-in) depends on one hand on the fan-out required, and on the other hand on the geometry of the device. By subdividing the row of collectors adjacent to the emitter into more and more AND inputs and by the provision of more OR collectors, the minimum output current for the condition $I_o=1$ must still be capable of drawing the greatest input current of the next stage.

The fan-out of the geometry of the device shown in FIGS. 11a is in the worst case 1 if $B_{npn}=20$ and similarly 5 if $B_{npn}=100$ ($B_{npn}$=current gain of the output npn transistor). If as above described the outputs are coupled over vertical pnp transistors, these values become greater by the pnp current gain.

Figure 12A:
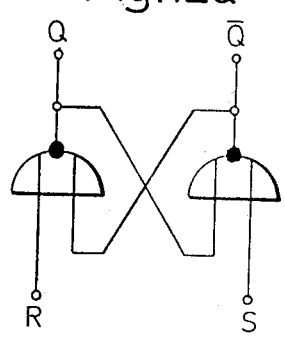
FIG. 12a is a diagram of a bistable flipflop with conventional gate symbols.
Figure 12B:
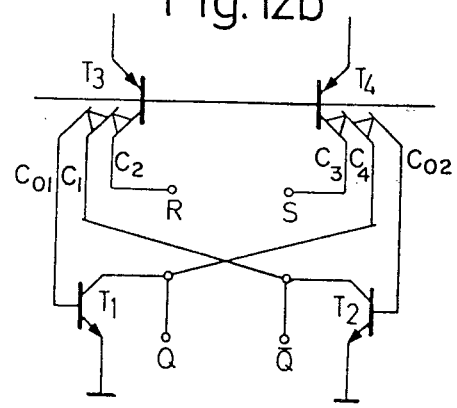
FIG. 12b is a diagram using the proposed symbolic representation of a bistable flipflop constituted according to the current source logic of the present invention.

FIGS. 12a and 12b show how a bistable flipflop can be constituted out of two NOR gates. To set the flipflop, a 1 must be applied to the input S and to reset the flipflop, a 1 must be applied at R, since "set" is defined as $Q=1; \overline{Q}=0$.

Let it now be assumed that transistor $T_1$ is conducting, i.e. $Q=1$. In that case, the biasing of the collector $C_2$ (with $C_3$ open) will divert the current source for the base current of transistor $T_1$. With the base current of transistor $T_1$ now interrupted, its collector potential gradually rises and as soon as this reaches within a few millivolts of the supply voltage, which is to say when collector $C_4$ of logic element $T_4$ becomes saturated, base current appears at transistor $T_2$, but only after the passage of a short delay time $\tau$, which is necessary for the build-up of charge carriers in the base of $T_4$. Now that transistor $T_2$ has base current, its collector potential gradually falls.

Figure 12C:
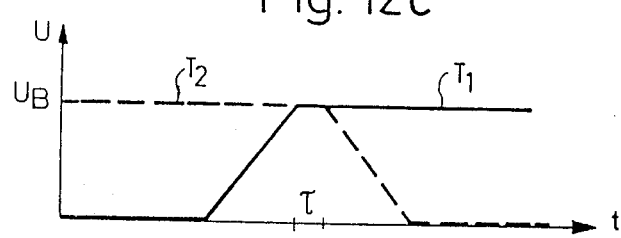
FIG. 12c is a timing diagram of the collector potentials upon the resetting of the bistable flipflop constituted by current source logic.

FIG. 12c is a timing diagram showing the course of the collector potentials of the transistors $T_1$ and $T_2$. The times required for rise and for fall of these potentials lie in the microsecond region and are determined by the Miller capacitances of the npn transistors and the currents of the collectors $C_1$ and $C_4$ of the logic structure.

Figure 13A:
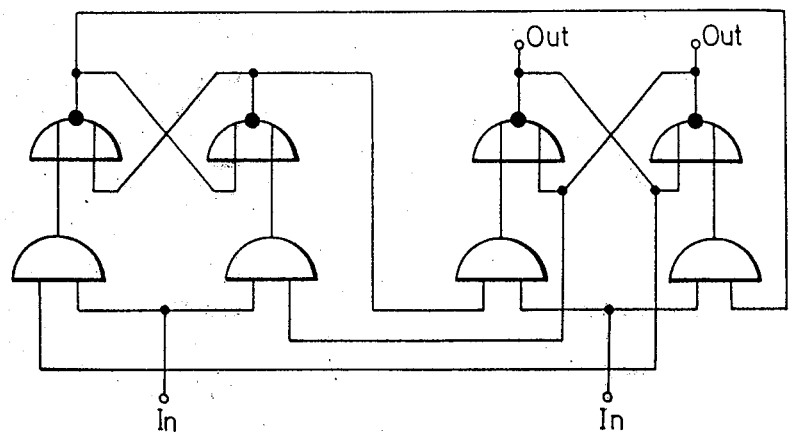
FIG. 13a is a circuit diagram of a static frequency divider cell, using conventional gate symbols.

The construction of a static frequency divider cell, operating according to the master-slave principle, can be described by gate symbols in the manner shown in FIG. 13a. Two bistable (set-reset) flipflops are required with AND gates connected before their set and reset inputs. To supply these AND gates in the flipflop circuit of FIG. 12b, all that is necessary is to subdivide each of the input (control) collectors $C_2$ and $C_3$ into two input collectors, resulting in the circuit shown in the upper part of FIG. 13b. In the lower part of FIG. 13b there have been added simply the decoupling pnp transistors which are here necessary for driving two inputs from a single output.

The transistors $T_4, T_6, T_{13}$ and $T_{15}$ are not strictly necessary. They increase the load capability of the output, however, and assure sufficient current gain in the npn-pnp combinations even when the gate output currents are very small. In order to determine the currents at which the circuit is operated one resistor is needed for all divider cells (in this case an external resistor Rex, FIG. 13b), and the reference transistor $T_9$ makes the currents nearly independent of the current gain of the pnp logic structure. Furthermore its collectors C (FIG. 14) prevent undesired carrier diffusion as it does C' of FIG. 11a.

The timing diagram of the output signals corresponds to that of FIG. 12c. Since the output signals of one divider cell can be used for directly controlling the next divider cell, it is possible to construct a divider chain of any desired length.

Figure 14:
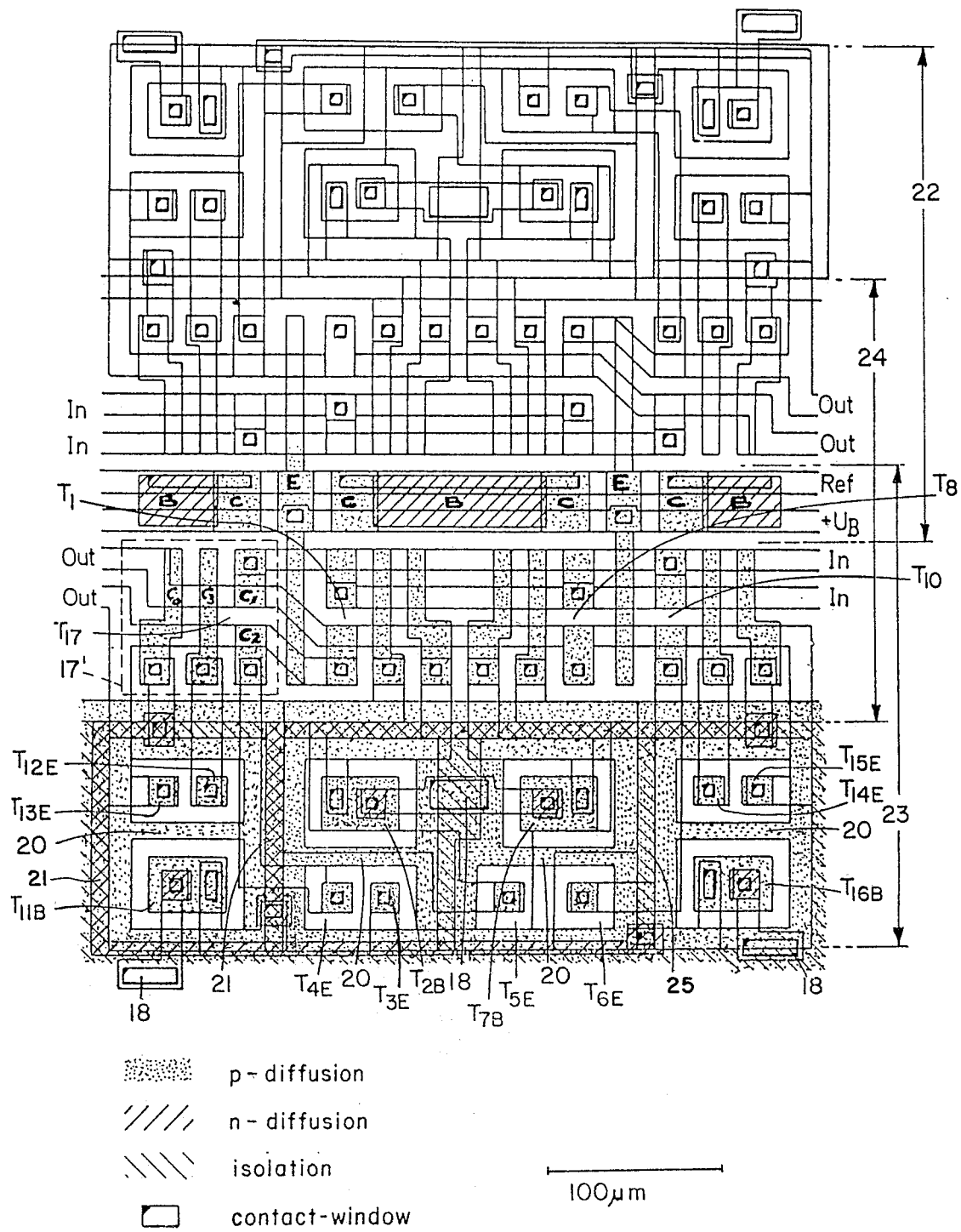
FIG. 14 is a layout diagram for a frequency divider double cell constituted in current source logic on the surface of a silicon chip.

The silicon surface layout of a frequency divider double cell is shown in FIG. 14. It should be noted that the pnp logic structures of both stages are laid down in one isolation island of the epitaxial layer and that for each divider stage, only four further isolation islands are used.

In order to accomplish the necessary crossovers, at suitable locations of the circuit, tunnels 21 of emitter materials are provided in isolation regions. This feature as well as the decoupling mentioned above are embodied in the layout shown in FIG. 14, as will be apparent from the following description of FIG. 14.

The silicon surface layout of a frequency divider double cell is shown in FIG. 14. It should be noted that the pnp logic structures of both stages are laid down in one isolation island of the epitaxial layer and that for each divider stage, only four further isolation islands are used.

In order to accomplish the necessary crossovers, at suitable locations of the circuit, tunnels 21 of emitter material are provided in isolation regions. This feature as well as the decoupling mentioned above are embodied in the layout shown in FIG. 14, as will be apparent from the following description of FIG. 14.

Figure 13B:
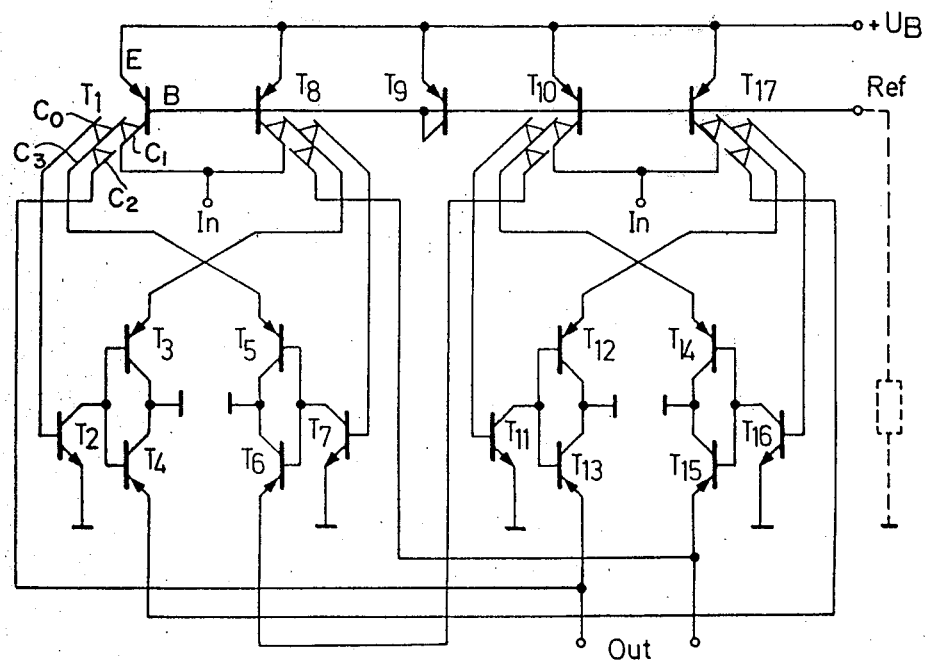
FIG. 13b is a circuit diagram of a static frequency divider cell constituted in current source logic.

The frequency divider double cell of which the silicon surface layout is shown in FIG. 14 corresponds to the circuit diagram given in FIG. 13b. It contains two stages of identical constitution. One of these stages occupies the upper half of FIG. 14, as indicated by the reference numeral 22 while the other, indicated by reference numeral 23 occupies the lower half. Furthermore, the PNP logic elements within the cells are so arranged that all logic elements of one divider chain can be located on a common isolated island, such as the island designated by reference numeral 24 occupying the central part of FIG. 14, including the lower half of the stage 22 and the upper half of the stage 23. In the two-stage module shown in FIG. 14, there are, as previously mentioned, eight additional isolated islands for the NPN reversal transistors and their associated vertical PNP transistors, four of these islands being in the top quarter of FIG. 14, serving the upper stage, while the other four are in the bottom quarter of FIG. 14 and serve the stage occupying the lower half of the figure. The connections $+U_B$ and Ref that appear at the top and are designated at the upper right in FIG. 13b are common to both stages and appear running horizontally across the middle of FIG. 14, representing aluminum stripe connection paths. Ground potential is supplied to the circuit at contact windows 18 connected to the NPN emitters and to the substrate and thereby to the isolation diffusion.

The physical layout of the logic elements and transistors is quite different from the layout in the circuit diagram given in FIG. 13b. In the lower stage or cell shown in FIG. 14, the order of the logic elements from left to right is $T_{17}, T_1, T_8, T_{10}$ and the NPN transistors and their associated vertical PNP transistors, from left to right, are in the sequence $T_{11}, T_2, T_7, T_{16}$. The transistors and logic elements are numbered in FIG. 14, of course, to agree with the designations in FIG. 13b.

As shown in FIG. 13b, the logic element E, the emitter connection for transistors $T_1, T_8, T_9, T_{10}$ and $T_{17}$, is connected to the potential bus $+U_B$. In FIG. 14 the E logic element appears as two vertical stripes, each connecting by a contact window where it crosses the central horizontal stripe $+U_B$. The left-hand vertical stripe serves as the emitter for $T_1$ and $T_8$ as well as for their undesignated components in the upper cell, and the right-hand vertical stripe serves as the emitter for $T_{10}$ and $T_{17}$ as well as for the corresponding undesignated transistors in the upper cell. Both of these stripes serve as emitters for the centrally located $T_9$, which is connected as a diode between $+U_B$ and Ref. To the left and right of the two emitter stripes just referred to as the logic elements E are the collectors $C_1, C_2, C_3$ and $C_0$ belonging to each of the gate structures of the multicollector transistors, from left to right of the diagram, as mentioned before, in the order $T_1, T_8, T_{10}$ and $T_{17}$. To make this clear, the collectors belonging to transistor $T_{17}$ are enclosed in a dashed square 17′ in FIG. 14. The NPN transistors of FIG. 13b, $T_{11}, T_2, T_7$ and $T_{16}$ are identified by their base regions on FIG. 14 by the designations $T_{11B}, T_{2B}$ and so on. Similarly, the vertical PNP transistors are identified by their emitter regions on FIG. 14 by designations $T_{13E}, T_{12E}, T_{4E}, T_{3E}, T_{5E}, T_{6E}, T_{14E}$ and $T_{15E}$.

The portions of the emitter stripes E facing the edges of the collectors C serve as reference collectors and constitute the transistor $T_9$ of FIG. 13b, already mentioned. Thus, this structure as well as the $+U_B$ and Ref stripes extending horizontally across the middle of the FIG. 14 layout, are shared by both the upper and lower stages of FIG. 14.

As mentioned before, care must be taken that no parasitic thyristor effect takes place in the combined NPN-PNP elements (e.g. $T_{11}, T_{12}, T_{13}$), which is to say that the charge carriers injected by the PNP emitters, $T_{13E}$ and $T_{12E}$ (FIG. 14), must not reach the NPN base $T_{11B}$, for example. The p-diffused strips 20 (35 in FIGS. 15 and 16) are accordingly provided between the PNP emitters and the NPN bases, and these strips run into the p-type surface border of the n-type island (32 in FIGS. 15 and 16) which overlaps the p-type isolation trough (37 in FIG. 16; 25 in FIG. 14) which extends down to the p-type bottom layer 4 (FIG. 16). The emitters and collectors of the logic structures, the emitters of the vertical PNP's and the NPN bases, as well as the surface isolation strips, are all part of the same diffusion effect.

Aluminum strip paths (unshaded in FIG. 14: e.g., "In" and "Out") are put on across the top of the logic structures and the combined NPN-PNP transistors. In each divider stage, moreover, two additional n+-diffused tunneling paths 21 and 21′ are utilized which provide (path 21) the connection between the output collector of $T_{17}$ and the base of $T_{16}$ and likewise (path 21′) between the output collector of $T_{10}$ and the base of $T_{11}$. These n tunnels lie in the p-type diffusion overlapping the isolation regions and as shown have the same width as the isolation trough bottoms.

FIGS. 15 and 16 show the geometry and a cross-section of a npn reversal transistor with two vertical pnp decoupling transistors in the same island, as used in the frequency divider. 10, 11 and 12 are emitter, base and collector of the npn portion and 13, 12 and 14 are emitter, base and collector of the pnp portion.

For prevention of a parasitic thyristor effects, decoupling is provided for the combined npn-pnp structures (e.g., $T_2, T_3, T_4$) by means of a p-type surface strip (15 of FIG. 16) between the npn portion and the pnp portion of the npn epitaxial island. This strip connects at its ends to a p-type surface border of the npn island that overlies the p-type isolation trough which surrounds the island and separates it from other n-type regions of the semiconductor material (as shown in FIG. 16).

Logic structures of this invention, because of their utilization of lateral pnp structures, have inherently good dynamic noise immunity. All switching times lie in the microsecond regions, as the result of which short duration dynamic disturbances are suppressed. Static noise immunity considerations differ widely from the usual ones, since logic levels are defined by currents. Hence reverse decoupling-diode resistance enables all gates, which are driven by a common output, to be operated from varying and different voltages within the full supply voltage range.

This logic structure is very economical of silicon chip surface, because the logic functions are not accomplished by individual transistors but by functional structures which are particularly well suited to accomplish complicated gate functions. Furthermore, all logic elements can be laid down in a single isolation island of the epitaxial surface. For each output, only one additional npn transistor is needed.

Logic circuits of this invention operate in a supply voltage range of about 0.7 volt to $H_{CEOnpn}$.

This logic structure is particularly well designed for standard silicon planar technology. No particular requirements regarding the component parameters are imposed.

For purposes of generality the terms "OR-gate" and "OR function" are used to include NOR gates and functions, and likewise the terms "AND-gate" and "AND function" as used herein include NAND gates and functions.

I claim:

1. A logic structure of the silicon planar type comprising:
   a silicon substrate;
   lateral pnp transistor structures constituting a plurality of logic elements arranged in successive logic stages and each set in an n-type island portion (14) of an epitaxial layer serving as a common base element, each said pnp transistor structure comprising, for each logic element:
   a p-type diffusion-formed emitter zone (E);
   a p-type diffusion-formed output collector zone ($C_0$) in the neighborhood of said emitter zone;
   at least one additional p-type diffusion-formed collector zone ($C_1$, $C_2$) located between said emitter zone and said output collector zone, the number and disposition thereof being chosen for performance of a logic function with respect to every control collector current as logic input and output collector current as logic output by virtue of the ability of each said control collector zone ($C_1$, $C_2$) positioned as aforesaid to prevent, when provided with voltage bias negative with respect to said emitter zone (E), charge carriers injected by said emitter zone (E) from reaching portions of said output collector zone ($C_0$) screened from said emitter zone by said particular control collector zone; and
   an npn output current reversal transistor ($T_r$) coupled to said output collector zone, having a base which is constituted by a p-type zone diffusion formed in an n-type layer that is separated by a p-type isolation strip from the n-type layer in which said output collector zone is diffusion-formed but which p-type base zone is electrically connected to said output collector zone ($C_0$), said current reversal transistor having a collector which feeds the output connection for the logic output of the logic element to which said output collector zone ($C_0$) belongs;
   connections being provided for causing the output of one stage to control zones of the logic elements of at least two stages following said one stage, at least one of said collector zones of said elements of said following stages being located so that at least one other of said collector zones is interposed between it and the corresponding one of said emitter zones, a control lead connection being provided to said control collector zone not adjacent to its corresponding emitter; and
   a diode oriented in its conductive direction for control current and interposed in said control lead connection for decoupling the inputs of the respective following stages.

2. A logic structure of the siicon planar type comprising:
   a silicon substrate;
   lateral pnp transistor structures constituting a plurality of logic elements arranged in successive logic stages, each stage set in an n-type island portion (14) of an epitaxial layer serving as a common base element, each said pnp transistor structure comprising for each logic element:
   a p-type diffusion-formed emitter zone (E);
   a p-type diffusion-formed output collector zone ($C_0$) in the neighborhood of said emitter zone;
   at least one additional p-type diffusion-formed control collector ($C_1$, $C_2$) located between said emitter zone and said output collector zone, the number and dispostion thereof being chosen for performance of a logic function with respect to every control collector current as logic input and output collector current as logic output, by virtue of the ability of each said control collector ($C_1$, $C_2$) positioned as aforesaid to prevent, when provided with voltage bias negative with respect to said emitter zone (E) charge carriers injected by said emitter zone (E) from reaching portions of said output collector zone ($C_0$) screened from said emitter zone by the particular control collector zone;
   an npn output current reversal transistor ($T_r$) coupled to said output collector zone, having a base which is constituted by a p-type zone diffusion formed in an n-type layer that is separated by a p-type isolation strip from the n-type layer in which said output collector zone is diffusion formed but which p-type base zone is electrically connected to said output collector zone ($C_0$), said current reversal transistor having a collector which feeds the output connection for the logic output of the logic element to which said output collector zone ($C_0$) belongs;
   connections being provided for causing the output of said element of one stage to control the respective collector zones of a plurality of said elements in following stages; and
   vertical pnp transistors, for purposes including addition of current amplification to the current amplification provided by said current reversal transistors of the respective logic stages, respectively connected to the collector zones of said logic elements in said following stages.

3. A logic structure of the silicon planar type comprising:
   a silicon substrate;
   lateral pnp transistor structures constituting at least one logic element set in an n-type island portion (14) of epitaxial layers serving as a common base element, each said pnp transistor structure comprising, for each logic element:
   a p-type diffusion-formed emitter zone (E);
   a p-type diffusion-formed output collector zone ($C_0$) in the neighborhood of said emitter zone;
   at least one additional p-type diffusion-formed collector zone ($C_1$, $C_2$) located between said emitter zone and output collector zone, the number and disposition thereof being chosen for performance of a logic function with respect to every control collector current as logic input and output collector current as logic output by virtue of the ability of each said control collector zone ($C_1$, $C_2$) positioned as aforesaid to prevent, when provided with voltage bias negative with respect to said emitter zone (E), charge carriers injected by said emitter zone (E) from reaching portions of said output collector zone ($C_0$) screened from said emitter zone by said particular control collector zone; and
   an npn output current reversal transistor ($T_r$) coupled to said output collector zone, having a base which is constituted by a p-type zone diffusion formed in an n-type layer that is separated by a p-type isolation strip from the n-type layer in which said output collector zone is diffusion formed but which p-type base zone is electrically connected to said output collector zone ($C_0$), said current reversal transistor ($T_r$) having also a collector usable for feeding an output therefrom and a plurality of vertical pnp transistors for providing a fanned-out output to a plurality of output connections of said logic element, the n-type base layer of each of said pnp transistors being a portion of the same semiconducting n-type layer that provides the collector of said npn output current reversal transistor and thereby providing the electric connection between said last-mentioned collector and said vertical pnp transistors.

4. A logic structure of the planar type comprising:
a silicon substrate;
lateral pnp transistor structures constituting at least one logic element set in an n-type island portion (14) of an epitaxial layer serving as a common base element, each said pnp transistor structure comprising, for each logic element:
a p-type diffusion-formed emitter zone (E);
a p-type diffusion-formed output collector zone ($C_0$) in the neighborhood of said emitter zone;
at least one additional p-type diffusion-formed collector zone ($C_1$, $C_2$) located between said emitter zone and said output collector zone, the number and disposition thereof being chosen for performance of a logic function with respect to every control collector current as logic input and output collector current as logic output by virtue of the ability of each said control collector zone ($C_1$, $C_2$) positioned as aforesaid to prevent, when provided with voltage bias negative with respect to said emitter zone (E), charge carriers injected by said said emitter zone (E) from reaching portions of said output collector zone ($C_0$) screened from said emitter zone by said particular control collector zone;
an npn output current reversal transistor ($T_r$) coupled to said output collector zone, having a base which is constituted by a p-type zone diffusion formed in an n-type layer that is separated by a p-type isolation strip from the n-type layer in which said output collector zone is diffusion formed but which p-type base zone is electrically connected to said output collector zone ($C_0$), said current reversal transistor having also a collector usable for feeding an output therefrom;
a vertical pnp decoupling transistor for providing an output connection of said logic element, of which decoupling transistor the n-type base layer is a portion of the same semi-conducting n-type base layer that provides the collector electrode of said npn output current reversal transistor and constitutes an epitaxial island above a p-type substrate layer surrounded by said p-type isolation strip;
said p-type isolation strip extending down to said p-type substrate; and
a p-type surface strip shallower than said semi-conducting n-type layer and crossing said epitaxial island between the portion of said n-type island in which said npn current reversal transistor is located and the portion of said n-type island in which said vertical pnp decoupling transistor is located for prevention of undesired thyristor effects, said surface strip connecting at its ends with said p-type isolation strip.

5. A logic structure as defined in claim 3 in which said n-type layer providing the respective base electrodes of said vertical pnp decoupling transistors and the collector electrode of said npn current reversal transistor is an n-type epitaxial island above a p-type substrate layer surrounded by said p-type isolation strip extending down to said p-type substrate layer, and a p-type surface strip is provided between the portion of said n-type island in which said npn current reversal transistor is located and the portion of said n-type island in which said vertical pnp decoupling transistors are located, for prevention of undesired thyristor effects, said surface strip connecting at its ends with a p-type border strip of said n-type island overlapping said p-type isolation strip.

* * * * *